United States Patent
Sano et al.

(10) Patent No.: US 8,420,994 B2
(45) Date of Patent: Apr. 16, 2013

(54) DETECTING DEVICE AND SOLID-STATE IMAGING DEVICE

(75) Inventors: Takafumi Sano, Matsumoto (JP); Naohiko Aoyagi, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 398 days.

(21) Appl. No.: 12/726,773

(22) Filed: Mar. 18, 2010

(65) Prior Publication Data

US 2010/0308208 A1 Dec. 9, 2010

(30) Foreign Application Priority Data

Jun. 8, 2009 (JP) ................................. 2009-137221

(51) Int. Cl.
*H01L 27/14* (2006.01)

(52) U.S. Cl.
USPC .............. 250/208.1; 250/214 R; 250/214 LS; 348/297; 257/291

(58) Field of Classification Search ............... 250/208.1, 250/214 R, 214 SW, 214 LS, 214 A; 348/294, 348/297, 300, 308; 257/291, 298, 300
See application file for complete search history.

(56) References Cited

U.S. PATENT DOCUMENTS

| 6,051,857 A | 4/2000 | Miida |
| 6,423,958 B1 | 7/2002 | Okamoto et al. |
| 2011/0242378 A1* | 10/2011 | Mabuchi ..................... 348/296 |

FOREIGN PATENT DOCUMENTS

| JP | A-11-195778 | 7/1999 |
| JP | A-2001-230973 | 8/2001 |
| JP | A-2009-182901 | 8/2009 |

* cited by examiner

*Primary Examiner* — Kevin Pyo
(74) *Attorney, Agent, or Firm* — Oliff & Berridge, PLC

(57) ABSTRACT

A solid-state imaging device includes a light receiving section having a plurality of threshold voltage modulation pixel circuits each configured including a MOS transistor having a gate electrode connected to a supply terminal of a gate voltage of a vertical scanning circuit, and a source electrode connected to one end of each capacitor of a line memory group via a switching element, and a photodiode having an anode connected to a back-gate electrode of the MOS transistor and a cathode connected to a drain electrode thereof, and a buffer circuit having an input terminal connected to a supply line of a control voltage of the control voltage supply means adapted to supply the vertical scanning circuit with the control voltage, and an output terminal connected to the other end of each capacitor, and having a signal transfer characteristic the same as that of the pixel circuit.

5 Claims, 4 Drawing Sheets

DETECTING DEVICE AND SOLID-STATE IMAGING DEVICE

The present patent application claims priority to Japanese Patent Application 2009-137221, filed on Jun. 8, 2009, which is incorporated herein by reference.

TECHNICAL FIELD

An aspect of the present invention relates to, for example, a detecting device and a solid-state imaging device having a detecting element for outputting a signal, which is obtained by adding a signal corresponding to a physical input of a detecting object to a reference voltage input, as a detection signal.

BACKGROUND ART

In the past, in a solid-state imaging device provided with a detecting element for detecting the intensity (luminance) of irradiation light such as reflected light from a shooting subject as a physical input, there has been provided a light receiving section having a corresponding number of detecting elements (pixels) to the size of a screen arranged in a matrix. As one of the detecting elements constituting such pixels, there has been known a threshold voltage modulation image sensor (VMIS: Vth Modulation Image Sensor). The VMIS is for converting the charge corresponding to an amount of light into a voltage and reading it using a substrate modulation effect of a MOS transistor. To put it concretely, threshold voltage used when switching the operation of the MOS transistor from OFF to ON is changed in accordance with the charge caused by light reception, and the change in the threshold voltage is output as a pixel signal. On this occasion, a bias voltage is applied to a gate electrode and a drain electrode in the MOS transistor, and the pixel signal is read out from the source electrode as a follower circuit.

More specifically, the pixel in the solid-state imaging device is composed of an insulated gate MOS transistor for detecting an image signal and a photodiode. In particular in the case of the pixel of the VMIS, the cathode of the photodiode is connected to the drain electrode, and the anode side thereof is connected to the back gate electrode on the substrate. The MOS transistor part of this area has a high-density buried layer for accumulating light-generated charge generated by light irradiation in the photodiode provided in the well region adjacent to the source region and under the gate electrode. In other words, the threshold voltage is modulated by accumulating the light-generated charge in the high-density buried layer, thereby detecting the pixel signal. As the whole pixels, predetermined numbers of pixels are respectively provided in row and column directions in a matrix manner to thereby form a light receiving section.

In the light receiving section, the gate electrodes of a plurality of pixels constituting each row are commonly connected to each other to form a gate line. Further, it is arranged that in a detection period of the pixel signal, a vertical scanning circuit, which outputs a scanning signal for setting the gate electrode of the MOS transistor to an active state for each row, controls the voltage sequentially applied to the gate lines, thereby reading out the pixel signals. Further, drain lines each formed by commonly connecting the drain electrodes of the MOS transistors and the cathodes of the photodiodes in the pixels of each row are commonly connected to each other on the whole pixels from an electrical point of view. Further, it is arranged that a drive circuit controls a drive voltage applied to the drain line to thereby perform accumulation of the light signal and reading out of the pixel signals.

The source line formed by commonly connecting the source electrodes of the MOS transistors in the pixels of each of the columns is connected to one end of a first line memory composed of a plurality of capacitive elements each accumulating and holding the charge corresponding to the output voltage from the pixel to which the scanning signal is input, and one end of a second line memory composed of a plurality of capacitive elements each accumulating and holding the charge corresponding to the output voltage from the pixel immediately after resetting the stored charge of the pixel. Then, when resetting the pixels, a reset circuit applies a reset voltage to the pixels to perform reset (discharge of the stored charge). Further, under the control of the vertical scanning circuit, the pixel signal immediately after the reset is transmitted to the second line memory. Further, when reading out the pixel signal, the pixel signal is transmitted to the first line memory under the control of the vertical scanning circuit. Incidentally, in this case, the other end side of each of the capacitive elements is connected to the ground.

It should be noted that well-known technologies related to such a solid-state imaging device (a solid-state imaging element) and the pixel configuration used therefor are disclosed in, for example, Patent Document 1 and Patent Document 2.

RELATED ART DOCUMENT

Patent Document

[Patent Document 1] JP-A-11-195778
[Patent Document 2] JP-A-2001-230973

SUMMARY OF THE INVENTION

Problem that the Invention is to Solve

In the case of the solid-state imaging device of the related art using the VMIS for the pixel configuration described above, there arises a problem that a horizontal stripe image, which is caused by an influence of mixture of a noise into the gate line of the light-receiving section to the pixels in the horizontal direction, cannot sufficiently be suppressed.

To put it concretely, if a channel length modulation is neglected when reading out the pixel signals, the drain current Id, the gate voltage Vg, and the source voltage Vs in the MOS transistor in a saturation range are expressed as the formula 1 below.

$$Id = 0.5 \mu \text{Cox}(W/L) \cdot \{Vg - Vs - V_{th}(\Phi)\}^{0.5} \quad (1)$$

It should be noted that here $\mu$ denotes mobility, Cox denotes gate capacitance W denotes gate width, L denotes gate length, and $V_{th}(\Phi)$ denotes a threshold voltage represented by a function of the light amount $\Phi$. According to the formula 1 described above, the output voltage Vs of the pixel signal is expressed as the formula 2 below.

$$Vs = Vg - V_{th}(\Phi) - (2Id/\mu \text{Cox})^{0.5} \cdot (L/W)^{0.5} \quad (2)$$

The gate voltage Vg when reading is equal to a direct current control voltage Vpgh (>Vpgl) input to the vertical scanning circuit, and is arranged to be in a voltage level setting the MOS transistor constituting the pixel to an active state. If a noise is mixed in a supply line of the control voltage, it results that the noise mixed in all of the pixels connected to a gate line vpgn. Here, when replacing the gate voltage Vg in the case in which the noise is mixed in assuming that an input noise voltage Vnoise is added to the control voltage Vpgh, the gate voltage Vg on this occasion is expressed by the formula 3 below.

$$Vg=(Vpgh+Vnoise)-V_{th}(\Phi)-(2Id/\mu Cox)^{0.5}\cdot(L/W)^{0.5} \quad (3)$$

In particular, since the control voltage Vpgh is commonly provided to the pixels of the light receiving section, arranged in a horizontal direction, the input noise voltage Vnoise is superimposed to all of the pixel outputs in one line. As a result, it appears on the image as the horizontal stripe. Since human eyes are sensitive to a stripe noise, even the input noise voltage Vnoise in the level of 1 mV is recognized as the horizontal stripe image. If it is attempted to set the input noise voltage Vnoise to be not higher than 1 mV as the measure against the above, since an inevitable external noise such as a power-supply noise is mixed therein in actuality, there arises a technical difficulty.

Therefore, the invention is made focusing attention on such an unsolved problem the related art has. According to some aspects of the invention, a detecting device and a solid-state imaging device suitable for reducing the noise component mixed in the detected signal due to the mixture of a noise to the reference voltage input to the detecting circuit can be provided.

Means for Solving the Problem

First Aspect

In order for achieving the object described above, the detecting device of a first aspect includes a detecting circuit adapted to output a voltage signal in response to input of a reference voltage, the voltage signal being obtained by adding a detected voltage corresponding to a physical input of a detection object to the reference voltage, a buffer circuit having the reference voltage as an input, and having a transfer characteristic the same as a signal transfer characteristic of the detecting circuit, and a differential signal generation means adapted to generate a signal of a difference between a voltage signal the detecting circuit outputs and a voltage signal the buffer circuit outputs.

According to the configuration described above, when the reference voltage is input to the detection circuit, a voltage signal obtained by adding the detected voltage corresponding to the physical input such as light, vibration, pressure, or heat as the detection object to the reference voltage thus input is output from the detecting circuit.

On the other hand, when the reference voltage the same as one input to the detecting circuit is input to the buffer circuit, in the buffer circuit the input reference voltage is transmitted with the transfer characteristic the same as that of the detecting circuit, and the voltage signal corresponding to the transfer characteristic is output.

Then, the differential signal between the voltage signal output from the detecting circuit and the voltage signal output from the buffer circuit is generated by the differential signal generation means.

Therefore, there can be obtained an advantage that if a noise is mixed in the reference voltage, the noise component can be eliminated or reduced from the voltage signal in which the noise is mixed and output from the detecting circuit.

Further, if the same reference voltage is input to the detecting circuit, there is caused a variation in the voltage signal output therefrom in accordance with a use condition such as the frequency of the input signal due to the constituent circuit element such as a transistor. According to the configuration described above, a signal of the difference between the voltage signal via the buffer circuit having the same transfer characteristic as that of the detecting circuit and the voltage signal output from the detecting circuit can be generated. Therefore, there can also be obtained an advantage that as the detection signal corresponding to the physical input, the signal in which the error of the output variation due to the transfer characteristic of the detecting circuit can also be reduced in addition to the noise component mixed in the reference voltage can be obtained.

Here, in the case in which the detecting circuit includes a transistor, the "transfer characteristic" described above can be defined by the transfer function using the size of the transistor, the frequency of the signal, the input current value and so on as parameters. Hereinafter, the same can be applied to the detecting device of the second aspect and the solid-state imaging device of the seventh aspect.

Further, the "same transfer characteristic" described above is defined to include the case in which an error within a range where the noise can be reduced or the variation due to the transfer characteristic can be reduced or eliminated exists in addition to the case of perfect matching. Hereinafter, the same can be applied to the detecting device of the second aspect and the solid-state imaging device of the seventh aspect.

Second Aspect

Further, according to the second aspect, in the detecting device of the first aspect, the detecting circuit is a threshold voltage modulation circuit including a first MOS transistor and a photodiode, receiving irradiation light from outside as the physical input with the photodiode to perform photoelectric conversion, accumulating charge generated by the photoelectric conversion to modulate a threshold voltage of the first MOS transistor, and outputting a voltage signal corresponding to a voltage obtained by adding a voltage corresponding to the accumulated charge to a reference voltage input to a gate electrode of the first MOS transistor from a source electrode of the first MOS transistor.

According to the configuration described above, the detection signal corresponding to the physical value of the irradiation light as the detection object can be obtained with high accuracy using the threshold voltage modulation detecting circuit.

Third Aspect

Further, according to the third aspect, in the detecting device of the second aspect, the buffer circuit is a source follower circuit including a second MOS transistor of a channel type the same as a channel type of the first MOS transistor, and having a configuration in which parameters of the second MOS transistor are set so that a voltage gain and a cutoff frequency the same as the voltage gain and the cutoff frequency of the detecting circuit are achieved.

According to the configuration described above, since the buffer circuit is configured using the source follower circuit having substantially the same circuit configuration as the detecting circuit driven as a source follower, there can be obtained an advantage that the transfer characteristic (the voltage gain, the cutoff frequency, and so on) of the buffer circuit can easily be matched with the transfer characteristic of the detecting circuit.

Further, by adopting substantially the same circuit configurations to the detecting circuit and the buffer circuit, it is possible to match the transfer characteristics of the both parties with high accuracy, and therefore, there can also be obtained an advantage that the component of the noise mixed in the reference voltage and the variation due to the transfer characteristic can be reduced or eliminated with higher accuracy.

Here, as the parameters described above, there can be cited the parameters such as the gate length, the gate width, the mobility of the carrier, the gate capacitance, and the drain current value of the MOS transistor composing the buffer circuit, related to the transfer characteristic of the detection circuit such as the voltage gain or the frequency characteristic (e.g., the cutoff frequency). Hereinafter, the same can be applied to the detecting device of the fourth and fifth aspects and the solid-state imaging device of the seventh, eighth, and ninth aspects.

Fourth Aspect

Further, according to the fourth aspect, in the detecting device of the second aspect, the buffer circuit includes a first source follower circuit having a configuration of including a third MOS transistor having a channel type the same as a channel type of the first MOS transistor and a gate electrode to which the reference voltage is input, and having parameters of the third MOS transistor set so as to have a voltage gain the same as a voltage gain of the detecting circuit, and a second source follower circuit having a configuration of including a fourth MOS transistor having a channel type different from a channel type of the third MOS transistor and a gate electrode connected to the source electrode of the third MOS transistor, and having parameters of the fourth MOS transistor set so as to have a cutoff frequency the same as a cutoff frequency of the detecting circuit.

Further, the differential signal generation means includes a capacitive element connected between a source electrode of the first MOS transistor and a source electrode of the fourth MOS transistor.

According to the configuration described above, the buffer circuit can match the voltage gain with that of the detecting circuit in the first source follower circuit, and match the cutoff frequency with that of the detecting circuit in the second source follower circuit.

Further, the differential signal generation means can accumulate the voltage signal output from the detecting circuit into the capacitive element, and thus obtain the signal of the difference between the voltage signal thus accumulated and the voltage signal output from the buffer circuit.

Further, the first source follower circuit can be configured using the transistor having the size with which the voltage gain can be matched with relatively small amount of current value.

Further, when generating the signal (the detection signal) of the difference by the differential signal generation means, it is possible to make the current flow into the second source follower circuit from the source electrode of the detecting circuit. Thus, it becomes possible to set the amount of current constantly flowing into the fourth transistor to the amount of current enough for making the fourth MOS transistor become in the active state.

Therefore, since it becomes possible to reduce power consumption in the detecting circuit, there can also be obtained an advantage that the temperature rise of the buffer circuit, and the dark current caused by the temperature rise can be reduced in addition to the advantage of the third aspect described above.

Fifth Aspect

Further, according to the fifth aspect, in the detecting device of the second aspect, the buffer circuit includes a first source follower circuit having a configuration of connecting a plurality of third MOS transistors each having a characteristic the same as a characteristic of the first MOS transistor in parallel to each other so as to have a voltage gain the same as a voltage gain of the detection circuit, and inputting the reference voltage to gate electrodes of the plurality of third MOS transistors, and a second source follower circuit having a configuration of including a fourth MOS transistor having a channel type different from a channel type of the third MOS transistor and a gate electrode connected to the source electrodes of the plurality of third MOS transistors of the first source follower circuit, and having parameters of the fourth MOS transistor set so as to have a cutoff frequency the same as a cutoff frequency of the detecting circuit, and Further, the differential signal generation means includes a capacitive element connected between a source electrode of the first MOS transistor and a source electrode of the fourth MOS transistor.

According to the configuration described above, the buffer circuit can match the voltage gain with that of the detecting circuit in the first source follower circuit having the configuration of connecting the third MOS transistors parallel to each other in a multiple-stage manner, and match the cutoff frequency with that of the detecting circuit in the second source follower circuit.

Further, the differential signal generation means can accumulate the voltage signal output from the detecting circuit into the capacitive element, and obtain the signal of the difference between the voltage signal thus accumulated and the voltage signal output from the buffer circuit.

Further, since the first source follower circuit has an output load smaller than the output load of the capacitive elements, it is possible to sufficiently increase the cutoff frequency. Therefore, by connecting the third MOS transistors having the characteristic (e.g., a size) the same as that of the first MOS transistor parallel to each other in a multiple-stage manner, it is possible to control the input current value and the size.

As described above, there can be obtained an advantage that the first source follower circuit can easily be designed in addition to the advantage of the fourth aspect.

Sixth Aspect

Further, in order for achieving the object described above, a solid-state imaging device of the sixth aspect includes a light receiving section having a plurality of threshold voltage modulation pixel circuits arranged in a matrix of n rows (n is a natural number equal to or larger than 1)×m columns (m is a natural number equal to or larger than 1), each including a first MOS transistor and a photodiode, receiving and photo-electrically converting irradiation light from outside with the photodiode, accumulating charge generated by the photoelectric conversion to modulate a threshold voltage of the first MOS transistor, and outputting a voltage signal corresponding to a voltage obtained by adding a voltage corresponding to the accumulated charge to a reference voltage input to a gate electrode of the first MOS transistor from a source electrode of the first MOS transistor as a pixel signal, a vertical scanning circuit adapted to scan the pixel circuits by row to input the reference voltage for setting the gate electrodes of the first MOS transistors constituting the pixel circuits to an active state by row to the gate electrodes of the first MOS transistors in each row selected by the scan, a reset circuit adapted to input a reset voltage with a predetermined potential to one of a source electrode and a drain electrode of the first MOS transistor for performing a reset operation of releasing the charge accumulated in the photodiode, a first line memory having m first capacitive elements adapted to accumulate the charge corresponding to the pixel signal output after exposure from m pixel circuits in each row to which the reference voltage is input, a second line memory having m second capacitive elements adapted to accumulate the charge corresponding to the pixel signal output immediately after reset from the m pixel circuits in each row to which the reference voltage is input, a buffer circuit having the reference voltage for the vertical scanning as an input, and having a transfer characteristic the same as a signal transfer characteristic of the detecting circuit, a differential signal generation means adapted to generate a first differential signal as a signal of a difference between the pixel signal corresponding to the charge accumulated in each of the first capacitive elements of the first line memory and a voltage signal the buffer circuit outputs, and a second differential signal as a signal of a difference between the pixel signal corresponding to the charge accumulated in each of the second capacitive elements of the second line memory and a voltage signal the buffer circuit outputs, and a imaging signal generation means adapted to generate an imaging signal as a signal of a difference between the first differential signal and the second differential signal.

According to the configuration described above, when the scanning is performed by the vertical scanning circuit, and the reference voltage is input to each of the pixel circuits in the selected row, the pixel signal, which is the voltage signal obtained by adding the detected voltage corresponding to the irradiation light such as reflected light from the shooting subject, namely the detection object, to the reference voltage thus input, is output from the pixel circuit to which the reference voltage is input.

The pixel signal output from the pixel circuit after the exposure is accumulated in the first capacitive element of the first line memory, and the pixel signal output from the pixel circuit immediately after resetting due to the reset operation of the reset circuit is accumulated in the second capacitive element of the second line memory.

On the other hand, when the reference voltage the same as one input to the pixel circuit is input to the buffer circuit, in the buffer circuit the input reference voltage is transmitted with the transfer characteristic the same as that of the pixel circuit, and the voltage signal corresponding to the transfer characteristic is output.

Further, the differential signal generation means generates the first differential signal as the signal of the difference between the pixel signal accumulated in the first capacitive element and the voltage signal output from the buffer circuit, and generates the second differential signal as the signal of the difference between the pixel signal accumulated in the second capacitive element and the voltage signal output from the buffer circuit.

Further, the imaging signal generation means generates the imaging signal as the signal of the difference between the first differential signal and the second differential signal generated by the differential signal generation means.

Therefore, there can be obtained an advantage that if a noise is mixed in the reference voltage, the noise component can be eliminated or reduced from the pixel signal in which the noise is mixed and output from the pixel circuit.

Further, if the same reference voltage is input to the pixel circuit, there is caused a variation in the pixel signal output therefrom in accordance with a use condition such as the frequency of the input signal since the pixel circuit is composed of the MOS transistor. According to the configuration described above, the signal (the first differential signal) of the difference between the voltage signal via the buffer circuit having the same transfer characteristic as that of the pixel circuit and the pixel signal output from the pixel circuit can be generated. In addition, it is possible to generate the signal (the second differential signal) of the difference between the pixel signal immediately after the reset and the voltage signal via the buffer circuit, and then to generate the imaging signal as the signal of the difference between the first differential signal and the second differential signal as a final output signal.

According to the above, there can be obtained an advantage that the imaging signal in which the noise component inherent in the pixel circuit such as an error component of the output variation due to the transfer characteristic of the pixel circuit and the fixed pattern noise are reduced or eliminated in addition to the component of the noise mixed in the reference voltage can be obtained.

Seventh Aspect

Further, according to the seventh aspect, in the solid-state imaging device of the sixth aspect, the buffer circuit is a source follower circuit including a second MOS transistor of a channel type the same as a channel type of the first MOS transistor, and having a configuration in which parameters of the second MOS transistor are set so that a voltage gain and a cutoff frequency the same as the voltage gain and the cutoff frequency of the pixel circuit are achieved.

According to the configuration described above, since the buffer circuit is configured using the source follower circuit having substantially the same circuit configuration as the pixel circuit driven as a source follower circuit, there can be obtained an advantage that the transfer characteristic (the voltage gain, the cutoff frequency, and so on) of the buffer circuit can easily be matched with the transfer characteristic of the pixel circuit.

Further, by adopting substantially the same circuit configurations to the pixel circuit and the buffer circuit, it is possible to match the transfer characteristics of the both parties with high accuracy, and therefore, there can also be obtained an advantage that the component of the noise mixed in the reference voltage and the variation due to the transfer characteristic can be reduced or eliminated with higher accuracy.

Eighth Aspect

Further, according to the eighth aspect, in the solid-state imaging device of the sixth aspect, the buffer circuit includes a first source follower circuit having a configuration of including a third MOS transistor having a channel type the same as a channel type of the first MOS transistor and a gate electrode to which the reference voltage is input, and having parameters of the third MOS transistor set so as to have a voltage gain the same as a voltage gain of the pixel circuit, and a second source follower circuit having a configuration of including a fourth MOS transistor having a channel type different from a channel type of the third MOS transistor and a gate electrode connected to the source electrode of the third MOS transistor, and having parameters of the fourth MOS transistor set so as to have a cutoff frequency the same as a cutoff frequency of the pixel circuit, and the differential signal generation means includes a first switching element having one end connected to the source electrode of the first MOS transistor and the other end connected to one end of the first capacitive element corresponding to each row, a second switching element having one end connected to the source electrode of the first MOS transistor and the other end connected to one end of the second capacitive element corresponding to each row, a third switching element having one end connected to the other end of the first capacitive element corresponding to each row, and the other end connected to an input terminal of the first differential signal of the imaging signal generation means, a fourth switching element having one end connected to the other end of the second capacitive element corresponding to each row, and the other end connected to an input terminal of the second differential signal of the imaging signal generation means, and a control section adapted to control switching operations of the first through fourth switching elements.

According to the configuration described above, the buffer circuit can match the voltage gain with that of the pixel circuit in the first source follower circuit, and match the cutoff frequency with that of the pixel circuit in the second source follower circuit.

Further, the first source follower circuit can be configured using the transistor having the size with which the voltage gain can be matched with relatively small amount of current value.

Further, when generating the signal (the first and second differential signals) of the difference by the differential signal generation means, it is possible to make the current flow into the second source follower circuit from the source electrode of the pixel circuit using the switching elements. Thus, it becomes possible to set the amount of current constantly flowing into the fourth transistor to the amount of current enough for making the fourth MOS transistor become in the active state.

Therefore, since it becomes possible to reduce power consumption in the pixel circuit, there can also be obtained an advantage that the temperature rise of the buffer circuit, and the dark current caused by the temperature rise can be reduced in addition to the advantage of the seventh aspect described above.

Ninth Aspect

Further, according to the ninth aspect, in the solid-state imaging device of the sixth aspect, the buffer circuit includes a first source follower circuit having a configuration of connecting a plurality of third MOS transistors each having a characteristic the same as a characteristic of the first MOS transistor in parallel to each other, and inputting the reference voltage to a gate electrode of the third MOS transistor in a first stage, and a second source follower circuit having a configuration of including a fourth MOS transistor having a channel type different from a channel type of the third MOS transistor and a gate electrode connected to the source electrode of the third MOS transistor in the last stage of the first source follower circuit, and having parameters of the fourth MOS transistor set so as to have a cutoff frequency the same as a cutoff frequency of the pixel circuit, and the differential signal generation means includes a first switching element having one end connected to the source electrode of the first MOS transistor and the other end connected to one end of the first capacitive element corresponding to each row, a second switching element having one end connected to the source electrode of the first MOS transistor and the other end connected to one end of the second capacitive element corresponding to each row, a third switching element having one end connected to the other end of the first capacitive element corresponding to each row, and the other end connected to an input terminal of the first differential signal of the imaging signal generation means, a fourth switching element having one end connected to the other end of the second capacitive element corresponding to each row, and the other end connected to an input terminal of the second differential signal of the imaging signal generation means, and a control section adapted to control switching operations of the first through fourth switching elements.

According to the configuration described above, the buffer circuit can match the voltage gain with that of the pixel circuit in the first source follower circuit having the configuration of connecting a plurality of third MOS transistors parallel to each other, and match the cutoff frequency with that of the pixel circuit in the second source follower circuit.

Further, since the first source follower circuit has an output load smaller than the output load of the first and second capacitive elements, it is possible to sufficiently increase the cutoff frequency. Therefore, by connecting a plurality of third MOS transistors having the characteristic (e.g., a size) the same as the first MOS transistor parallel to each other, it is possible to easily control the drain current value and the gate width.

As described above, there can be obtained an advantage that the first source follower circuit can easily be designed in addition to the advantage of the eighth aspect.

MODE FOR CARRYING OUT THE INVENTION

First Embodiment

An embodiment of the invention will hereinafter be explained with reference to the accompanying drawings. FIGS. 1 through 5 are diagrams showing a first embodiment of a detecting device and a solid-state imaging device according to the invention.

Configuration

Figure 1:
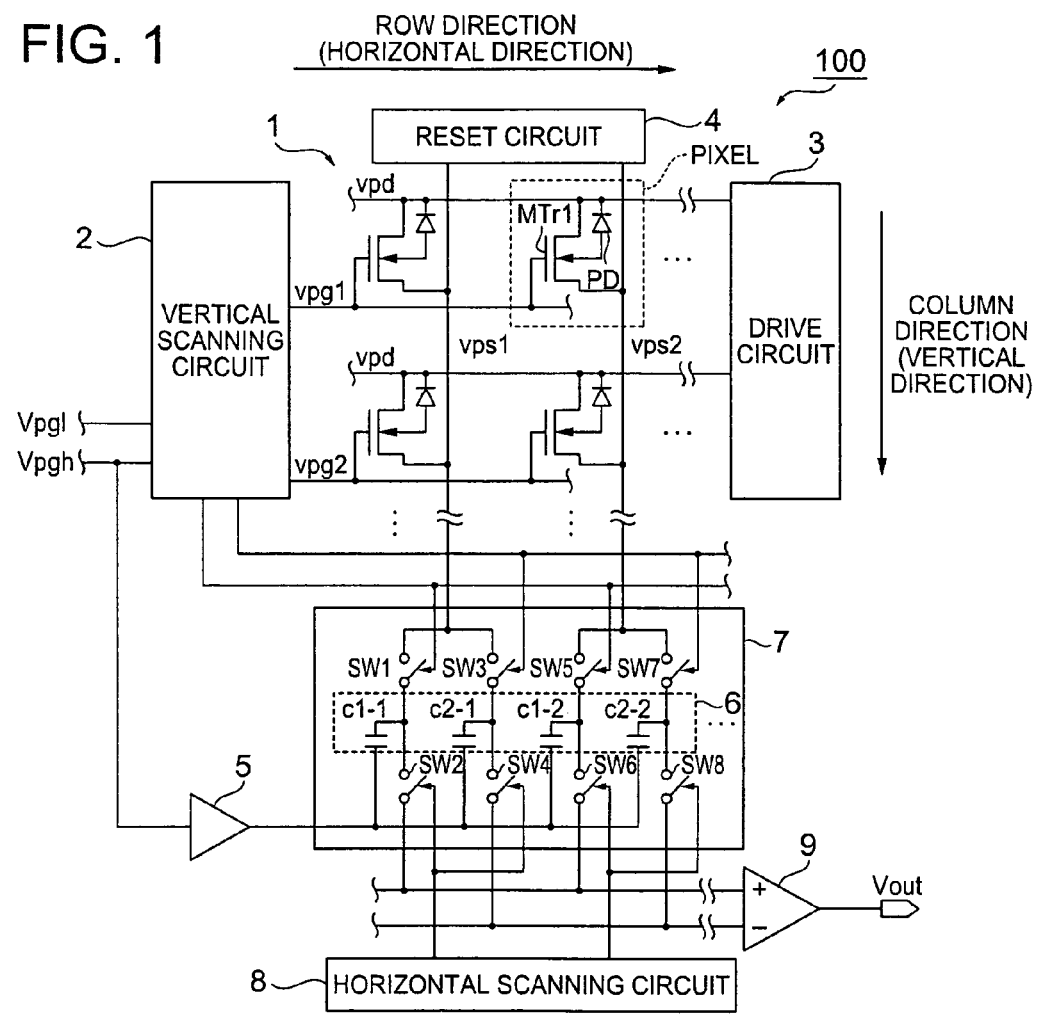
FIG. 1 is a diagram showing a configuration of a solid-state imaging device 100 according to the invention.

Firstly, a configuration of the solid-state imaging device according to the invention will be explained with reference to FIG. 1. FIG. 1 is a diagram showing the configuration of the solid-state imaging device 100 according to the invention.

As shown in FIG. 1, the solid-state imaging device 100 is configured including a light receiving section 1, a vertical scanning circuit 2, a drive circuit 3, a reset circuit 4, a buffer circuit 5, a line memory group 6, a differential signal generation section 7, a horizontal scanning circuit 8, and a subtraction circuit 9.

The light receiving section 1 has a configuration of arranging a predetermined number of pixels (indicated by a dotted frame) in row and column directions to form a matrix.

As shown in the dotted frame in FIG. 1, each of the pixel circuits is configured including a MOS transistor MTr1 (hereinafter simply referred to as MTr1) and a photodiode PD (hereinafter simply referred to as PD). A cathode of the PD is connected to a drain electrode of the MTr1, and an anode thereof is connected to a back-gate electrode of the MTr1.

Further, the drain electrode of the MTr1 of each of the pixel circuits is connected to a supply line of a drive voltage vpd supplied from the drive circuit 3.

Further, a gate electrode of the MTr1 of each of the pixel circuits in the first row is commonly connected to a first supply line for supplying a gate bias voltage Vpg of the vertical scanning circuit 2 to form a first gate line vpg1. Further, the gate electrode of the MTr1 of each of the pixel circuits in the second row is commonly connected to a second supply line for supplying the gate bias voltage Vpg of the vertical scanning circuit 2 to form a second gate line vpg2.

Further, a source electrode of the MTr1 of each of the pixel circuits constituting the first column is commonly connected to a first signal line having one end connected to the reset circuit 4 and the other end connected to one end of a capacitor as a capacitive element constituting the line memory group 6, to thereby form a first source line vps1. Further, the source electrode of the MTr1 of each of the pixel circuits constituting the second column is connected to a second signal line having one end connected to the reset circuit 4 and the other end connected to one end of a capacitor as the capacitive element constituting the line memory group 6, to thereby form a second source line vps2.

It should be noted that 2×2 pixel circuits are illustrated alone in FIG. 1 for the sake of simplicity of explanation, and the reference symbols are pursuant thereto. It should be noted that each of the pixel circuits is provided with a high-density buried layer as the PD, which is disposed in the vicinity of the source region of the MTr1 and inside the well region under the gate electrode. Further, there is formed a structure for detecting the pixel signal by modulating the threshold voltage of the MTr1 by accumulating the charge generated by performing photoelectric conversion on the irradiation light in the high-density buried layer.

The vertical scanning circuit 2 has a configuration of inputting the control voltages Vpgl, Vpgh (Vpgl (e.g., 1[V])<Vpgh (e.g., 2.5[V])) from an external control voltage generation means not shown.

Further, the vertical scanning circuit 2 outputs the control voltage Vpgh to gate lines corresponding respectively to the rows in an exposure period as a scanning signal (a reference signal) for setting the gate electrode of the MTr1 to an active state.

On the other hand, in a readout period of pixel signals, the control voltage Vpgh is output row-by-row to the gate lines corresponding respectively to the rows as the scanning signal (the reference signal) for setting the gate electrode of the MTr1 to the active state. Further, in a non-selection period of each of the rows, the control voltage Vpgl is output to the gate line corresponding to the row in the non-selection state, which is not a readout object.

The drive circuit 3 has a configuration of being connected to drain lines vpd each formed by commonly connecting the drain electrode of the MTr1 and the cathode of the PD in each of the pixel circuits of the light receiving section 1, arranged in the row direction.

Further, the drive circuit 3 is arranged to control the drive voltage applied to each of the drain lines vpd to thereby perform accumulation of the charge generated by irradiation light and readout of the pixel signal corresponding to the stored charge.

The reset circuit 4 is connected to the source lines vps1, vps2, and applies a reset voltage to the source electrode of the MTr1 of each of the pixel circuits via the source lines vps1, vps2 to reset (discharge) the charge stored in the PD (the high-density buried layer) of each of the pixel circuits when resetting the pixel circuit.

The buffer circuit 5 is a circuit having a signal transfer characteristic similar to that of the pixel circuit, has an input terminal to which the supply line of the control voltage Vpgh of the control voltage generation means, not shown, is connected, transmits the control voltage Vpgh thus supplied with the transfer characteristic similar to that of the pixel circuit, and then outputs it from an output terminal.

The line memory group 6 has a first line memory configured including capacitors c1-1, c1-2 as a plurality of capacitive elements for accumulating the pixel signal after the exposure. Further, the line memory group 6 has a second line memory configured including capacitors c2-1, c2-2 for accumulating the pixel signal immediately after the reset.

The differential signal generation section 7 is configured including switching elements sw1 through sw8, and the switching operations of the switching elements sw1 through sw8 are controlled by the control signals from the vertical scanning circuit 2 and the horizontal scanning circuit 8. Here, the switching elements sw1 through sw8 are composed of elements such as transistors for switching on/off in response to input of the control signals of, for example, the MOS transistors.

Specifically, the sw1 has one end connected to the source line vps1, and the other end connected to one end of the capacitor c1-1 and one end of the sw2, and the sw3 has one end connected to the source line vps1, and the other end connected to one end of the capacitor c2-1 and one end of the sw4.

Further, the sw5 has one end connected to the source line vps2, and the other end connected to one end of the capacitor c1-2 and one end of the sw6, and the sw7 has one end connected to the source line vps2, and the other end connected to one end of the capacitor c2-2 and one end of the sw8.

Further, the other ends of the capacitors c1-1, c1-2, c2-1, and c2-2 are connected to the output terminal of the buffer circuit 5.

As a specific operation, after the exposure for a predetermined time period, the sw1 and the sw5 are switched to the ON-state (a conduction state) in accordance with the control signals from the vertical scanning circuit 2. Thus, the charge corresponding to the potential of the signal (the first differential signal) of the difference between the pixel signal after the exposure (before the reset) from the pixel circuit and the voltage signal from the buffer circuit 5 is accumulated in the c1-1 or the c1-2.

In other words, the pixel signal is transmitted to the first line memory having the capacitors c1-1, c1-2 when reading out the pixel signal after the exposure. Then, in the capacitors c1-1, c1-2, the charge of the first differential signal as the difference between the pixel signal after the exposure and the voltage signal (the reference voltage+an input noise) output by the buffer circuit 5 is accumulated and then held.

The pixel signal after the exposure includes a signal component (a light receiving component+the reference voltage+ the noise mixed in the reference voltage (hereinafter referred to as an input noise)) and a noise (a fixed pattern noise) inherent in the pixel circuit. Further, the voltage signal output by the buffer circuit 5 includes the reference voltage and the input noise. Therefore, it results that the first differential signal is composed of the signal component (the light receiving component) and the fixed pattern noise.

Further, immediately after the reset, the sw3 and the sw7 are switched to the ON-state (the conduction state) in accordance with the control signals from the vertical scanning circuit 2. Thus, the charge corresponding to the potential of the signal (the second differential signal) of the difference between the pixel signal immediately after the reset from the pixel circuit and the voltage signal from the buffer circuit 5 is accumulated in the c2-1 or the c2-2.

In other words, the pixel signal immediately after resetting is transmitted to the second line memory having the capacitors c2-1, c2-2 when reading out the pixel signal immediately after the reset. Then, in the capacitors c2-1, c2-2, the charge of the second differential signal as the difference between the pixel signal immediately after resetting and the voltage signal output by the buffer circuit 5 is accumulated and then held.

The pixel signal immediately after resetting includes the signal component (the reference voltage+the input noise) and the fixed pattern noise. Therefore, the second differential signal becomes a signal dominated mainly by the component of the fixed pattern noise.

The horizontal scanning circuit 8 is for transmitting switching control signals, which are for individually opening and closing (switching ON/OFF) the sw2 and the sw4 connected to one ends of the respective capacitors of a pair of capacitors c1-1, c2-1, and the switching elements SW6 and SW8 connected to one ends of the respective capacitors of a pair of capacitors c1-2, c2-2, to the respective switching elements.

Specifically, the horizontal scanning circuit 8 transmits the switching control signal to firstly set the sw2 to the ON state (the electrically conductive state), thereby transmitting the charge stored in the c1-1 to an input terminal on a positive terminal side of the subtraction circuit 9. The horizontal scanning circuit 8 continuously transmits the control signal to set the sw6 to the ON state, thereby transmitting the charge stored in the c1-2 to the input terminal on the positive terminal side of the subtraction circuit 9.

On the other hand, the horizontal scanning circuit 8 transmits the control signal, which is for controlling opening and closing of the switching element, in sync with the timing of setting the sw2 to the ON state to set the sw4 to the ON state, thereby transmitting the charge stored in the c2-1 to an input terminal on a negative terminal side of the subtraction circuit 9. Subsequently, by transmitting the control signal in sync with the timing of setting the sw6 to the ON state, to set the sw8 to the ON state, the charge stored in the c2-2 is transmitted to the input terminal on the negative terminal side of the subtraction circuit 9.

The subtraction circuit 9 sequentially outputs a signal of a difference between the charge corresponding to the accumulated charge of the photodiode PD of the pixel circuit accumulated in the capacitors c2-1, c1-2 of the first line memory and the charge corresponding to the fixed pattern noise component immediately after the reset, and accumulated in the capacitors c1-2, c2-2 of the second line memory, as an imaging signal with an output voltage Vout.

Figure 2:
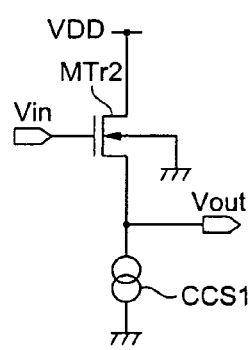
FIG. 2 is a diagram showing an example of a circuit configuration of a buffer circuit 5 of a first embodiment.

Then, with reference to FIG. 2, a detailed circuit configuration of the buffer circuit 5 of the present embodiment will be explained. FIG. 2 is a diagram showing an example of the circuit configuration of the buffer circuit 5.

As shown in FIG. 2, the buffer circuit 5 is configured including an N-channel MOS transistor MTr2 having a conductivity type the same as that of the N-channel MOS transistor constituting the pixel circuit, and a constant current source CCS1.

The MTr2 has a gate electrode connected to the supply line of the control voltage Vpgh, a source electrode connected to one end of the constant current source CCS1, and a drain electrode connected to a supply line of the power supply with a voltage VDD. Further, the other end of the CCS1 is connected to the ground line as the ground potential.

Then, a voltage signal having a potential obtained by subtracting a threshold voltage $V_{th2}$ of the MTr2 from the control voltage Vpgh thus input is output from the source electrode. In other words, the buffer circuit 5 forms a source follower circuit.

Further, in the present embodiment, the buffer circuit 5 is designed so that the transfer characteristic of the signal of the pixel circuit and the transfer characteristic of the signal of the buffer circuit 5 match with each other.

Specifically, the buffer circuit 5 is designed using the MTr2 as the transistor the same as the MTr1 constituting the pixel circuit. Thus, it becomes possible to make the voltage gains of the MTr1 and the MTr2 have values very near to each other.

Further, in the present embodiment, the gate length and the gate width of the MTr2, and the supply current value of the constant current source CCS1 are set based on the formulas 4 through 7 below so that the cutoff frequencies of the MTr1 and the MTr2 become equal to each other.

Hereinafter, a specific determination method of the gate length, the gate width, and the current value will be explained.

The transfer conductance of the MTr1 in the pixel circuit is denoted as $gm_{pix}$, the gate length is denoted as $L_1$, the gate width is denoted as $W_1$, the drain current is denoted as $Id_1$, the mobility of electrons is denoted a $\mu_1$, s the gate capacitance per unit area is denoted as $Cox_1$, and the capacitance of each of the capacitive elements constituting the line memory group 6 is denoted as C. Then, the cutoff frequency $f_{c\text{-}pix}$ of the MTr1 can be approximated as the formula 4 below.

$$f_{c\text{-}pix}gm_{pix}/2\pi C = \{2\mu_1 Cox_1(W_1/L_1)Id_1\}^{0.5}/2\pi C \quad (4)$$

Denoting the number of pixels of the light receiving section 1 arranged in the row direction as n, since the n capacitive elements act as the load, the cutoff frequency $f_{c\text{-}buf}$ of the buffer circuit 5 can be approximated as the formula 5 below denoting the transfer conductance of the MTr2 in the buffer circuit 5 as $gm_{buf}$.

$$f_{u\text{-}buf} = gm_{buf}/2\pi nC \quad (5)$$

In other words, since it is sufficient to set each of the parameters so that the formulas 4 and 5 described above become equal to each other, each of the parameters is set so that the transfer conductance satisfies the formula 6 below.

$$gm_{buf} = n \cdot gm_{pix} = n \cdot \{2\mu_1 Cox_1(W_1/L_1)Id_1\}^{0.5} \quad (6)$$

Here, if the mobility $\mu_1$ of the MTr1 and the mobility $\mu_2$ of the MTr2 are equal to each other, and the gate capacitance $Cox_1$ per unit area of the MTr1 and the gate capacitance $Cox_2$ per unit area of the MTr2 are equal to each other, the formula 7 below can be obtained.

$$f_{c\text{-}buf} = gm_{buf}/2\pi nC = \{2\mu_2 Cox_2(nW_1/L_2)nId_1\}^{0.5}/2\pi nC = f_{c\text{-}pix} \quad (7)$$

In other words, since "$\mu_1=\mu_2$" and "$Cox_1=Cox_2$" are satisfied, the gate width $W_2$ of the MTr2 is set to be the value obtained by multiplying the gate width $W_1$ of the MTr1 by n, and the drain current $Id_2$ flowing through the MTr2 is set to be the value obtained by multiplying the drain current $Id_1$ flowing through the MTr1 by n, respectively. Thus, it becomes possible to match the frequency characteristics of the pixel circuit and the buffer circuit 5 with each other.

It should be noted that in the case in which the gate capacitance $Cox_1$ per unit area of the MTr1 of the pixel circuit is smaller than the gate capacitance $Cox_2$ of the MTr2 of the buffer circuit 5, namely in the case of satisfying "$Cox_2=Cox_1/X$ (1<X)," the gate width $W_2$ of the MTr2 is set to be a value obtained by multiplying $W_1$ by Xn. Further, the drain current $Id_2$ flowing through the MTr2 is set to be the value obtained by multiplying $I_{d1}$ by n. For example, in the case in which "$Cox_2=Cox_1/2$" is satisfied, and the number n of pixel circuits arranged in the row direction is 2, $W_2$ is set to be $4 \times W_1$, and $Id_2$ set to be $2 \times Id_i$.

In the solid-state imaging device of the related art, the line memory group has a configuration substantially the same as that of the line memory group 6 described above, namely the configuration in which the other end of each of the capacitors c1-1, c2-1, c1-2, c2-2 is connected to the ground to be maintained at the ground potential. Therefore, when a noise is mixed in the control voltage to be input to the gate line of the pixel circuit, the noise is mixed in all of the pixel circuits connected to the common gate line. Thus, the horizontal stripe defect is caused in a captured image.

On the other hand, in the present embodiment, as described above, there is adopted the configuration of connecting the other ends of the capacitors c1-1, c2-1, c1-2, c2-2 to the supply line of the control voltage Vpgh respectively via the buffer circuit 5. In other words, there is adopted the configuration of removing or reducing the noise component mixed in the supply line of the control voltage Vpgh by subtracting the output signal component of the buffer circuit 5 from the pixel signal component output from the pixel circuit.

It should be noted that it is also possible to obtain the advantage of removing or reducing the noise component by connecting the other ends of the capacitors c1-1, c2-1, c1-2, c2-2 directly to the supply line of the control voltage Vpgh respectively without the buffer circuit 5 intervening therein.

However, the reason that there is adopted the configuration of connecting them via the buffer circuit 5 in the present embodiment as described above is primarily that the pixel circuit of the light receiving section 1 is composed of a threshold voltage modulation transistor. To put it concretely, when reading out a signal in a source follower manner with respect to the threshold voltage modulation transistor, it is not allowed to short the source electrode and the back-gate electrode of the MTr1. Therefore, the body effect is generated, and as shown in FIG. 3, the voltage gain becomes lower than 1.

Figure 3:
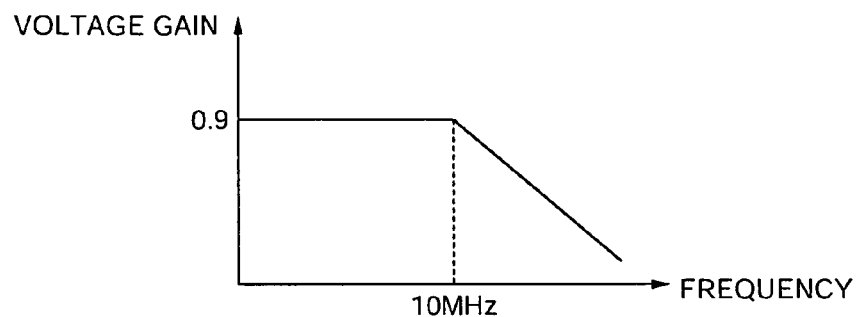
FIG. 3 is a diagram showing an example of a relationship between a frequency of an input signal and a voltage gain of a pixel circuit.

Here, FIG. 3 is a diagram showing an example of a relationship between a frequency of the input signal and the voltage gain of the pixel circuit. In the example shown in FIG. 3, the voltage gain becomes 0.9 times due to the body effect. In this case, if there is adopted the configuration of connecting them directly to the supply line of the control voltage Vpgh described above, it results that 10% of the input noise voltage Vnoise appears in the captured image as the horizontal stripe defect.

Further, the reason that there is adopted the configuration of connecting them via the buffer circuit 5 described above is secondarily that the MTr1 constituting the pixel circuit has a cutoff frequency. As shown in FIG. 3, it is assumed that the cutoff frequency of the MTr1 is set to be 10[MHz]. In this case, with respect to the frequency band higher than 10[MHz], the value of the pixel signal the pixel circuit outputs varies (becomes in a lower level) compared to the signal level thereof at a frequency equal to or lower than 10[MHz] due to the drop of the voltage gain.

As described above, the pixel circuit has a unique signal transfer characteristic. Therefore, in order for removing or reducing the influence of the noise mixed in the supply line of the control voltage Vpgh input to the pixel circuit from the pixel signal, it is required to put even the signal transfer characteristic of the pixel circuit into consideration.

Therefore, in the present embodiment, the buffer circuit 5 is designed based on the above formulas 4 through 7, so as to have the signal transfer characteristic identical to the signal transfer characteristic of the pixel circuit.

Thus, it is possible to eliminate or reduce the noise component reflecting the signal transfer characteristic of the pixel circuit such as an influence due to the body effect or an influence in the frequency band higher than the cutoff frequency from the pixel signal when the noise is mixed in the supply line of the control voltage Vpgh.

Operations

Then, actual actions of the present embodiment will be explained with reference to FIGS. 4 and 5.

Figure 4:
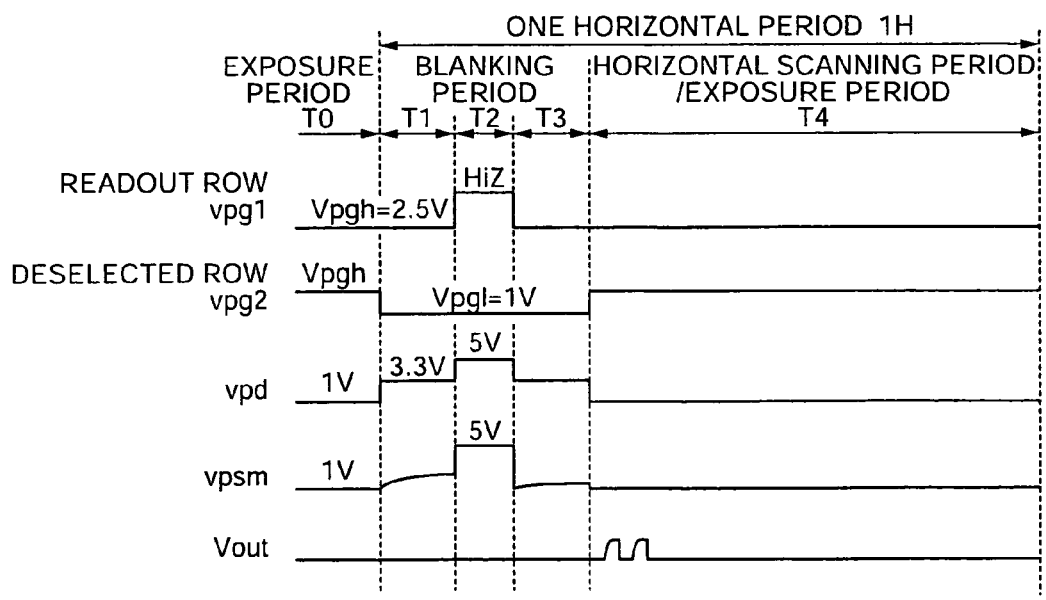
FIG. 4 is a timing chart of signals in respective sections in an operation process according to the solid-state imaging device 100.
Figure 5A:
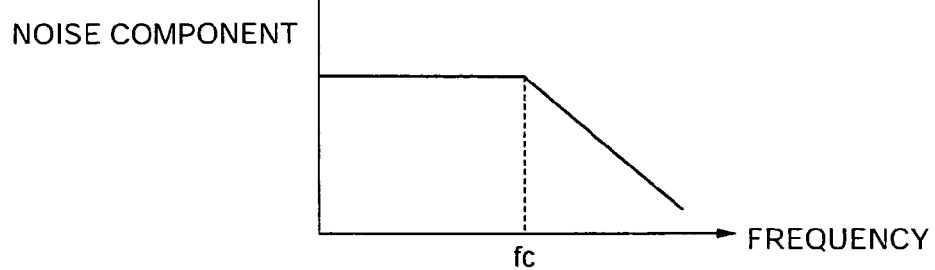
FIGS. 5A and 5B are diagrams showing a relationship between a frequency and a noise level of an input signal to the pixel circuit in the related art and the invention, respectively.
Figure 5B:
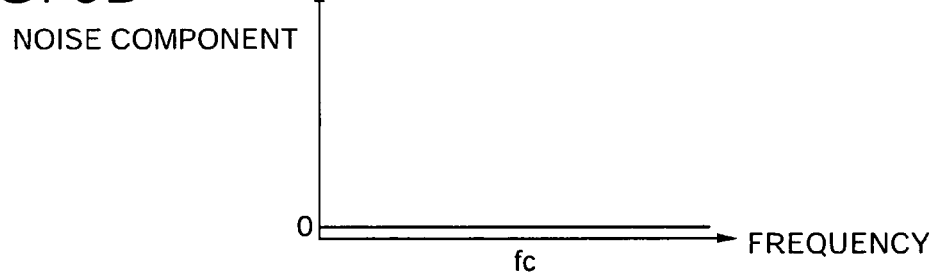

Here, FIG. 4 is a timing chart of signals in respective sections in an operation process according to the solid-state imaging device 100. Further, FIGS. 5A and 5B are diagrams showing a relationship between a frequency and a noise level of an input signal to the pixel circuit in the related art and the invention, respectively.

In FIG. 4, the period T0 prior to one horizontal period 1H is an exposure period, which is a period for accumulating the photoinduced charge received as light in the photodiode PD of each of the pixel circuit of the light receiving section 1. After the exposure period T0, the process proceeds to the one horizontal period 1H. The one horizontal period 1H can be divided into, blanking periods T1 through T3, and a horizontal scanning period/exposure period T4 subsequent thereto.

The early blanking period T1 is a period for reading out the pixel signal corresponding to an amount of light received before then.

Here, the case in which the pixels in the first row are set to be the readout row, and those in the second row are set to be a deselected row will be explained. For example, by setting the gate line vpg1 of the first row to be the control voltage Vpgh (=2.5V), the drain line vpd thereof to be 3.3V, the pixel signal corresponding to the amount of light is output to the source lines vps1, vps2. Although the pixels arranged in the column direction are connected commonly to the source lines vps1, vps2, since the voltage as low as the control voltage Vpgl (=1V) is applied to the source line vps2 of the deselected row, the pixel signal of the readout row, which is the source voltage, is output to the source line vps1, vps2. Further, due to the switching control by the vertical scanning circuit 2, the switching elements sw1, sw5 are set to the ON state, thus one ends of the capacitors c1-1, c1-2 of the first line memory are electrically connected to the source lines vps1, vps2, respectively.

Thus, since the electrical potentials of the other ends of the capacitors c1-1, c1-2 are set to be the electrical potential of the voltage signal output from the buffer circuit 5, the charge corresponding to the first differential signal, which is the signal of the difference between the pixel signal of the readout row and the voltage signal output from the buffer circuit 5, is accumulated and then held in the capacitors c1-1, c1-2, respectively.

The middle blanking period T2 is a period for performing reset (discharge) of the charge accumulated in the photodiode PD of the pixel circuit. Here, for example, the gate line vpg1 of the readout row is set to be high impedance HiZ, and the voltage of 5V is applied to the source lines vps1, vps2. Thus, since the gate line vpg1 is in the high impedance HiZ, the source voltage of the source lines vps1, vps2 rises to 5V, but the voltage of the gate line vpg1 is further raised to roughly 6V due to the capacitance between the gate and the source. As a result, in the pixel connected to the gate line vpg1, since the channel is provided with a voltage as high as 5V, the photoinduced charge accumulated in the PD of the pixel circuit is discharged, and the accumulated charge becomes "0." On the other hand, since the gate line vpg2 of the deselected row is provided with a voltage as low as the control voltage Vpgl (=1V), and the MOS transistor of the pixel circuit is kept in the OFF state even when the source lines vps1, vps2 become 5V, the pixel is not reset.

The late blanking period T3 is a period for reading out the pixel signal from the pixel circuit immediately after the reset.

Here, similarly to the case of the early blanking period T1, the pixels in the first row arranged in the horizontal direction are set to be the readout row, and those in the second row are set to be the deselected row, and the gate line vpg1 of the first row is set to be the control voltage Vpgh (=2.5V), and the drain line vpd is set to be 3.3V. Thus, the pixel signal, which is the source voltage immediately after the reset of the MTr1 of the pixel circuit of the selected row, and does not include the component of the photoinduced charge, is output to the source lines vps1, vps2.

Further, due to the switching control by the vertical scanning circuit 2, the switching elements sw3, sw7 are set to the ON state, thus one ends of the capacitors c2-1, c2-2 of the second line memory are electrically connected to the source lines vps1, vps2, respectively.

Thus, since the electrical potentials of the other ends of the capacitors c2-1, c2-2 are set to be the electrical potential of the voltage signal output from the buffer circuit 5, the charge corresponding to the second differential signal, which is the signal of the difference between the pixel signal of the readout row immediately after the reset and the voltage signal output from the buffer circuit 5, is accumulated and then held in the capacitors c2-1, c2-2, respectively.

The horizontal scanning period/exposure period T4 is a period for outputting the signal stored in the line memory group 6. Due to the switching control by the horizontal scanning circuit 8, the capacitive elements are sequentially selected via the switching elements sw2, sw4, sw6, and sw8.

Firstly, the sw2 is switched to the ON state to thereby output the first differential signal accumulated and then held in the capacitor c1-1 of the first line memory in the early blanking period T1 to the input line of the subtraction circuit 9 on the positive terminal side. In parallel thereto, the sw4 is switched to the ON state to thereby output the second differential signal accumulated and then held in the capacitor c2-1 of the second line memory in the late blanking period T3 to the input line of the subtraction circuit 9 on the negative terminal side.

Subsequently, the sw6 is switched to the ON state to thereby output the first, differential signal accumulated and then held in the capacitor c1-2 of the first line memory in the early blanking period T1 to the input line of the subtraction circuit 9 on the positive terminal side. In parallel thereto, the sw8 is switched to the ON state to thereby output the second differential signal accumulated and then held in the capacitor c2-2 of the second line memory in the late blanking period T3 to the input line of the subtraction circuit 9 on the negative terminal side.

Then, in the subtraction circuit 9, the difference between the first differential signal and the second differential signal is sequentially output as the imaging signal with the output voltage Vout.

The first differential signal includes a component of photoinduced charge due to the exposure and a component of the fixed pattern noise inherent in the pixel circuit. On the other hand, the second differential signal does not include the component of the photoinduced charge due to the exposure, but mainly includes the component of the fixed pattern noise.

Further, by calculating the difference between the first differential signal and the second differential signal, the image output having the image quality with the component of the fixed pattern noise canceled can be obtained.

In the horizontal scanning period/exposure period T4, the process proceeds to the subsequent exposure period subsequently to the output of the waveform level of the image signal.

Further, in the case of the solid-state imaging device 100 of the present embodiment, the other end of each of the capacitive elements (the capacitors) is connected to the output terminal of the buffer circuit 5. Therefore, even if the input noise voltage Vnoise in mixed in the supply line of the control voltage Vpgh, the influence of the Vnoise on the first differential signal accumulated and then held by the capacitors c1-1, c1-2 in the early blanking period T1 is eliminated or reduced. Further, since the buffer circuit 5 is designed to have the transfer characteristic identical to the transfer characteristic of the signal of the pixel circuit, the influence of the Vnoise is eliminated or reduced in the condition of reflecting the variation due to the transfer characteristic.

Similarly, with respect to the second differential signal accumulated and then held in the capacitors c2-1, c2-2 in the late blanking period T3, the influence of the Vnoise is eliminated or reduced in the condition of reflecting the variation due to the transfer characteristic.

Here, in the configuration in which the other end of each of the capacitors constituting the line memory is connected to the supply line of the control voltage Vpgh via the buffer circuit 5, the charge Q accumulated in each of the capacitors in the blanking period T1 or T3 has relations with the capacitance value C of the capacitor. Therefore, the charge Q can be expressed as the formula 8 below using the formula 3 described above.

$$Q = C \cdot \{(Vpgh + V\text{noise}) - V\text{th}(\Phi) - (2Id_1/\mu_1 Cox_1)^{0.5} \cdot (L_1/W_1)^{0.5} - (Vpgh + V\text{noise})\} = C \cdot \{-V\text{th}(\Phi) - (2Id_1/\mu_1 Cox_1)^{0.5} \cdot (L_1/W_1)^{0.5}\} \quad (8)$$

According to the formula 8 described above, it is recognized that even if the input noise voltage Vnoise due to the noise mixed in the supply line of the control voltage Vpgh is applied to the gate lines vpg1, vpg2, the influence of the input noise voltage Vnoise is eliminated.

Then, a setting method of the parameters of the buffer circuit 5 will be explained while citing a specific numerical example.

Here, it is assumed that the parameters with respect to the MOS transistor MTr1 of the pixel circuit satisfy "$\mu \times cox_1 = 30 \times 10^{-6}$ [A/V$^2$]n" "$L_1 = 1$ [μm]," "$W_1 = 10$ [μm]," and "$Id_1 = 2$ [μA]."

In this case, according to the formula 4 described above, the cutoff frequency $fc_{pix}$ of the pixel circuit is calculated as $fc_{pix} = 5.5$ [MHz].

Further, it is assumed that the capacitance C of each of the capacitors of the line memory group 6 satisfies "C=1 [pF]," and the number n of pixel circuits in each row satisfies "n=700."

Further, it is also assumed that the product of the mobility μ a of the MOS transistor MTr2 of the buffer circuit 5 and the gate capacitance $Cox_2$ is obtained as "$\mu \times Cox_2 = 120 \times 10^{-6}$ [A/V$^2$]."

In this case, according to the formula 7 described above, other parameters of the buffer circuit 5 are calculated as "$L_2 = 4$ [μm]," "$W_2 = 7$ [μm]," and "$Id_2 = 1.4$ [mA]." Further, the buffer circuit 5 is designed so that the parameters thus calculated are set.

Specifically, since "$\mu \times Cox_2$" of the buffer circuit 5 is four times as large as "$\mu \times Cox_1$" of the pixel circuit, it is designed so that the gate length $L_2$ of the MTr2 satisfies "$L_2 = 4 \times L_1 = 4$ [μm]." Further, since the number n of pixel circuits in each row is 700, the gate width $W_2$ and the drain current $Id_2$ of the MTr1 are designed to have values 700 times as large as the gate width $W_1$ and the drain current $Id_1$ of the MTr1, respectively.

Here, in the configuration of the related art in which no measures at all are taken against the noise mixed in the control voltage Vg, as shown in FIG. 5A, it results that the noise component varying in accordance with the signal transfer characteristic of the pixel circuit remains in the pixel signal. On the other hand, in the present embodiment, it is configured so that the control voltage Vpgh is output via the buffer circuit 5 designed as described above, and at the same time, the voltage signal thus output is subtracted from the pixel signal output from the pixel circuit. Therefore, when the noise is mixed in the control voltage Vpgh, even if the pixel signal varies in accordance with the signal transfer characteristic of the pixel circuit, the noise thus mixed can appropriately be reduced while following the variation as shown in FIG. 5B.

Therefore, the waveform of the image signal output from the subtraction circuit 9 of the solid-state imaging device 100 of the present embodiment does not have an influence of the mixed noise to the voltage level, thus the horizontal stripe image caused by the mixture of the noise in the gate line of the light receiving section 1 exerting influence on the pixels arranged in the horizontal direction (the row direction) in the related art device can be prevented with good accuracy.

As described hereinabove, in the solid-state imaging device 100 according to the present embodiment, the other end side of each of the capacitors c1-1, c2-1, c1-2, c2-2 constituting the line memory group 6 is connected to the supply line of the control voltage Vpgh via the buffer circuit 5 designed to have the transfer characteristic identical to the signal transfer characteristic of the pixel circuit.

Thus, even if a noise is mixed in the line of the control voltage Vpgh and the input nose voltage Vnoise is applied to the gate lines vpg1, vpg2 of the light receiving section 1, the influence of the input noise voltage Vnoise can appropriately be eliminated or reduced from the first differential signal and the second differential signal accumulated and then held in each of the capacitors of the line memory group 6.

Therefore, it is possible to eliminate or reduce the horizontal stripe image from the image formed in accordance with the imaging signal with the output voltage Vout obtained by the difference between the first differential signal corresponding to the pixel signal after the exposure and the second differential signal corresponding to, the pixel signal immediately after the reset.

In the first embodiment described above, the pixel circuit corresponds to the detecting circuit described in either one of the first, second, and third aspects, or to the pixel circuit described in the sixth or seventh aspect, and the buffer circuit 5 corresponds to the buffer circuit described in either one of the first, third, sixth, and seventh aspects.

Further, in the first embodiment described above, the MOS transistor MTr1 corresponds to the first MOS transistor described in either one of the second, third, sixth, and seventh aspects, and the MOS transistor MTr2 corresponds to the second MOS transistor described in either one of the second, third, sixth, and seventh aspects.

Further, in the first embodiment described above, the vertical scanning circuit 2 corresponds to the vertical scanning circuit described in the sixth aspect, the reset circuit 4 corresponds to the reset circuit described in the sixth aspect, and the subtraction circuit 9 corresponds to the imaging signal generation means described in the sixth aspect.

Further, in the first embodiment described above, the function of generating the first differential signal and the second differential signal, each of which is the signal of the difference between the voltage signal output from the buffer circuit 5 and the pixel signal output from the pixel circuit, achieved by the vertical scanning circuit 2, the line memory group 6, the differential signal generation section 7, and the horizontal scanning circuit 8 corresponds to the differential signal generation means described in the first aspect or the sixth aspect.

Second Embodiment

Figure 6A:
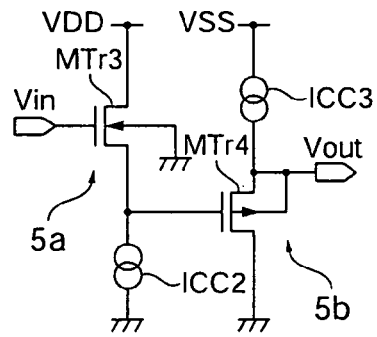
FIGS. 6A and 6B are diagrams showing a circuit configuration example of a buffer circuit 5 of a second embodiment.
Figure 6B:
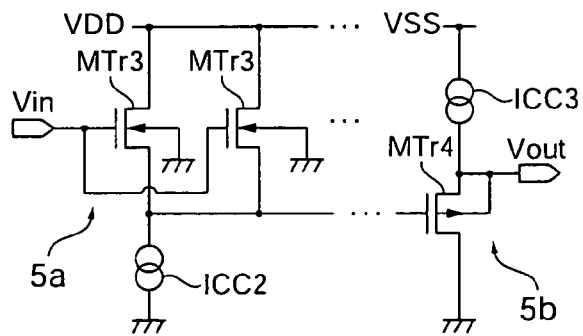

Hereinafter, a second embodiment of the invention will be explained with reference to the accompanying drawings. FIGS. 6A and 6B are diagrams showing a second embodiment of the detecting device and the solid-state imaging device according to the invention.

The present embodiment is different from the first embodiment described above only in the configuration of the buffer circuit 5 of the first embodiment described above, and has other constituents substantially the same as those of the solid-state imaging device 100 of the first embodiment.

Therefore, hereinafter, the parts substantially the same as those of the first embodiment are denoted with the same reference symbols, and the explanation therefor will be omitted if appropriate, and the parts different therefrom will be explained in detail.

Configuration

FIGS. 6A and 6B are diagrams showing a circuit configuration example of the buffer circuit 5 of the present embodiment.

In the present embodiment, as shown in FIG. 6A, the buffer circuit 5 is configured including a first source follower circuit 5a and a second source follower circuit 5b.

The first source follower circuit 5a is configured including a MOS transistor MTr3 having a channel type the same as that of the MOS transistor of the pixel circuit, and a constant current source ICC2. In other words, if the MTr1 is an N-channel MOS transistor, an N-channel MOS transistor is used also as the MTr3.

The MTr3 has a gate electrode connected to a supply line of the control voltage Vpgh of the control voltage supply means not shown, a drain electrode connected to the power supply line with the voltage VDD, and a source electrode connected to the constant current source ICC2. It should be noted that the MTr3 is a MOS transistor of a channel type the same as that of the MOS transistor MTr1 of the pixel circuit.

The second source follower circuit 5b is configured including a MOS transistor MTr4 having a polarity different from that of the MTr3, and a constant current source ICC3. In other words, if the MTr3 is an N-channel MOS transistor, a P-channel MOS transistor is used as the MTr4.

The MTr4 has a gate electrode connected to the source electrode of the MTr3, a drain electrode connected to the power supply line with the voltage VSS, and a source electrode connected to the other end of each of the capacitors of the line memory group 6.

Further, in the present embodiment, the first source follower circuit 5a is designed so that the voltage gain thereof becomes equal to the voltage gain of the pixel circuit, and the second source follower circuit 5b is designed so that the cutoff frequency thereof is equal to the cutoff frequency of the pixel circuit.

Specifically, the gate length $L_3$, the gate width $W_3$, and the drain current value $Id_3$ of the MTr3 of the first source follower circuit 5a are set so that the voltage gain of the first source follower circuit 5a becomes equal to the voltage gain of the pixel circuit with the minimum power consumption.

Further, the gate length $L_4$, the gate width $W_4$, and the drain current value $Id_4$ of the MTr4 of the second source follower circuit 5b are set so that the cutoff frequency of the second source follower circuit 5b becomes equal to the cutoff frequency of the pixel circuit.

Here, the minimum value of the drain current Id applied to the buffer circuit 5 is limited by the readout time and the load capacitance. For example, it is assumed that the number n of pixel circuits in each row and the number m of pixel circuits in each column satisfy "n×m=700×500," the negative load capacitance $C_L$ is 1 [pF], the readout time $T_r$ is 2 [μs], and the voltage amplitude $V_A$ is 1 [V]. In this case, the minimum drain current $Id_{min}$ necessary for the buffer circuit 5 of the first embodiment can be obtained by the formula 9 below.

$$Id_{min} = nC_L V_A / T_r \quad (9)$$

According to the formula 9 described above, the $Id_{min}$ can be obtained as "0.35 [mA]."

Taking the settling time and the variation in the current value into consideration, an actual value of the $Id_{min}$ is about "1 [mA]," which causes significant increase in power consumption. The increase in power consumption leads to temperature rise of the buffer circuit 5, and increases a dark current. Further, the increase in the dark current incurs deterioration in image quality of the captured image.

Therefore, in the present embodiment, a two-stage configuration is adopted to the buffer circuit 5 thereby reducing the power consumption as shown in FIG. 6A.

In other words, the MTr3 of the first source follower circuit 5a in the former stage is designed to have a gate width and a gate length with which the voltage gain equal to that of the pixel circuit can be obtained with an amount of current smaller than that of the buffer circuit 5 in the first embodiment described above. In this case, the cutoff frequency of the circuit in the former stage is sufficiently higher than that of the MTr1, and is therefore neglected.

Further, the cutoff frequency of the second source follower circuit 5b in the latter stage is made to match the cutoff frequency of the pixel circuit. The pixel signal flows into the MTr4 of the second source follower circuit 5b from the source lines vps1 and vps2 of the pixel via the line memory group 6. Since the current does not flow into the constant current source ICC3, the amount of current of the source follower circuit 5b flowing constantly can be reduced.

It should be noted that since the output load is smaller than the corresponding number of capacitive elements (the capacitors) to the number of rows of the pixel circuits, the cutoff frequency in the frequency characteristic of the first source follower circuit 5a in the former stage can be made sufficiently high. Therefore, as shown in FIG. 6B, by connecting a plurality of elements having the same characteristic as the MTr1 of the pixel circuit in parallel to each other, the voltage gain can easily be matched.

The buffer circuit 5 shown in FIG. 6B has the first source follower circuit 5a configured including a plurality of MTr3 (two in FIG. 6B). Specifically, each of the MTr3 has a gate electrode connected to a supply line of the control voltage Vpgh of the control voltage supply means not shown, a drain electrode connected to the power supply line with the voltage VDD, and a source electrode connected to the constant current source ICC2. It should be noted that the MTr3 is a MOS transistor having a characteristic the same as that of the MOS transistor MTr1 of the pixel circuit. Here, the same characteristic denotes that each of the parameters inherent in the MOS transistor such as the polarity, the gate length, the gate width, the mobility of the carrier, and the gate capacitance, are the same.

Due to the configuration described hereinabove, the buffer circuit 5 of the present embodiment is capable of outputting the voltage signal (Vpgh+Vnouse) reflecting the transfer characteristic in the same level (preferably the same, but within an allowable error range is also possible) as the pixel circuit in the case in which the noise (Vnoise) is mixed in the supply line of the control voltage Vpgh.

Operations

It should be noted that the actual operations of the present embodiment becomes substantially the same as those of the solid-state imaging device 100 of the first embodiment described above.

As described hereinabove, in the solid-state imaging device 100 according to the present embodiment, the other end side of each of the capacitors c1-1, c2-1, c1-2, c2-2 constituting the line memory group 6 is connected to the supply line of the control voltage Vpgh via the buffer circuit 5 designed to have the transfer characteristic identical to the signal transfer characteristic of the pixel circuit.

Thus, even if a noise is mixed in the line of the control voltage Vpgh and the input nose voltage Vnoise is applied to the gate lines vpg1, vpg2 of the light receiving section 1, the influence of the input noise voltage Vnoise can appropriately be eliminated or reduced from the first differential signal and the second differential signal accumulated and then held in each of the capacitors of the line memory group 6.

Therefore, it is possible to eliminate or reduce the horizontal stripe image from the image formed in accordance with the imaging signal with the output voltage Vout obtained by the difference between the first differential signal corresponding to the pixel signal after the exposure and the second differential signal corresponding to the pixel signal immediately after the reset.

Further, the solid-state imaging device 100 according to the present embodiment has the buffer circuit 5 having a configuration composed of the first source follower circuit 5a designed to have the voltage gain equal to that of the pixel circuit, and the second source follower circuit 5b designed to have the cutoff frequency equal to that of the pixel circuit.

Thus, by setting each of the parameters in the circuit in the former stage so that the voltage gain matches with the minimum amount of current, the current from the pixel circuit is supplied to the circuit in the latter stage, and therefore, the amount of current constantly applying to the buffer circuit 5 can be reduced as a whole.

Therefore, since the power consumption can be reduced compared to the configuration of the first embodiment described above, the amount of dark current can be reduced, and thus the image quality deterioration of the captured image can be reduced.

In the second embodiment described above, the pixel circuit corresponds to the detecting circuit described in either one of the first, second, fourth, and fifth aspects, or to the pixel circuit described in either one of the sixth, eighth and ninth aspects, and the buffer circuit 5 corresponds to the buffer circuit described in either one of the first, fourth, fifth, sixth, eighth, and ninth aspects.

Further, in the second embodiment described above, the MOS transistor MTr1 corresponds to the first MOS transistor described in either one of the second, fourth, fifth, sixth, eighth, and ninth aspects.

Further, in the second embodiment described above, the MOS transistor MTr3 corresponds to the third MOS transistor described in either one of the fourth, fifth, eighth, and ninth aspects, and the MOS transistor MTr4 corresponds to the fourth MOS transistor described in either one of the fourth, fifth, eighth, and ninth aspects.

Further, in the second embodiment described above, the vertical scanning circuit 2 corresponds to the vertical scanning circuit described in the sixth aspect, the reset circuit 4 corresponds to the reset circuit described in the sixth aspect, and the subtraction circuit 9 corresponds to the imaging signal generation means described in the sixth aspect.

Further, in the second embodiment described above, the function of generating the first differential signal and the second differential signal, each of which is the signal of the difference between the voltage signal output from the buffer circuit 5 and the pixel signal output from the pixel circuit, achieved by the vertical scanning circuit 2, the line memory group 6, the differential signal generation section 7, and the horizontal scanning circuit 8 corresponds to the differential signal generation means described in either one of the first, fourth, fifth, sixth, eighth, and ninth aspects.

It should be noted that although in the first and second embodiments, the explanation is presented citing the case, in which the threshold voltage modulation pixel circuit (detecting circuit) taking the irradiation light input from the outside as the detection object and capable of detecting the luminance level thereof is applied to the solid-state imaging device, as an example, the application object of the invention is not limited thereto.

Figure 7A:
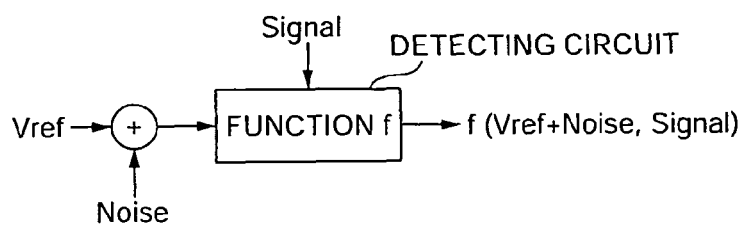
FIG. 7A is a diagram showing a system to which the invention is applied.
Figure 7B:
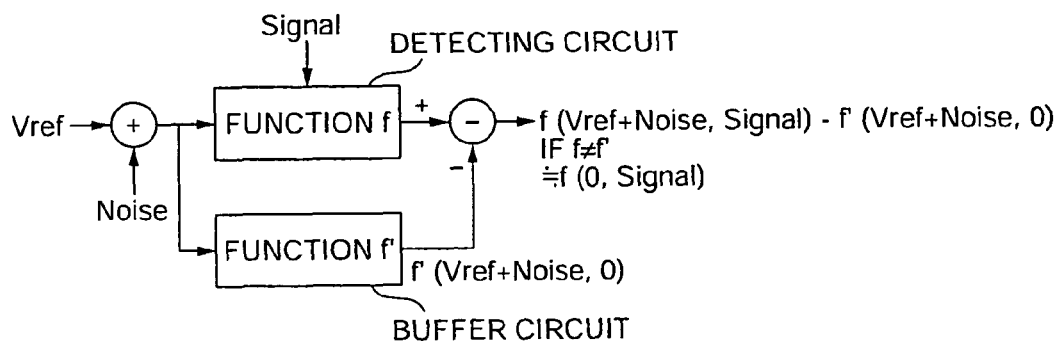
FIG. 7B is a diagram showing an example of applying the invention to the system shown in FIG. 7A.

Here, FIG. 7A is a diagram showing a system to which the invention is applied, and FIG. 7B is a diagram showing an example of applying the invention to the system shown in FIG. 7A.

As shown in FIG. 7A, the invention can be applied to the system in which an output is determined by the transfer function f with respect to the input of the reference voltage Vref and the noise (Noise), and a physical input (Signal) of the detection object. In the example of FIG. 7A, for example, the output can be expressed as f(Vref+Noise, Signal).

In other words, as shown in FIG. 7B, a buffer circuit having the Vref and Noise common to the detecting circuit as the input, and having the transfer function f' with the same characteristic (an error in the allowable range is allowable) as the transfer function f of the detecting circuit is provided to the system shown in FIG. 7A. Further, a difference generation means such as a circuit including a capacitive element or a subtraction circuit for generating a signal of the difference between the output of the buffer circuit and the output of the detecting circuit is provided. By adopting such a configuration, f(Vref+Noise, Signal) determined by the transfer function f is output from the detection circuit, and f'(Vref+noise, 0) determined by the transfer function f' is output from the buffer circuit. Here, since the buffer circuit is designed so as to achieve the relationship of "f=f'," the final output is obtained as f(0, Signal). In other words, the invention can be applied not only to the threshold voltage modulation pixel circuit (detecting circuit) or the solid-state imaging device, but also to the system using the detecting circuit other than the threshold voltage modulation pixel circuit, or the system applied to the device other than the solid-state imaging device providing the system is as shown in FIG. 7A.

The invention claimed is:

1. A detecting device comprising:
   a detecting circuit adapted to output a voltage signal in response to input of a reference voltage, the voltage signal being obtained by adding a detected voltage corresponding to a physical input of a detection object to the reference voltage;
   a buffer circuit having the reference voltage as an input, and having a transfer characteristic the same as a signal transfer characteristic of the detecting circuit; and
   a differential signal generation means adapted to generate a signal of a difference between a voltage signal the detecting circuit outputs and a voltage signal the buffer circuit outputs.

2. The detecting device according to claim 1, wherein
   the detecting circuit is a threshold voltage modulation circuit including a first MOS transistor and a photodiode, receiving irradiation light from outside as the physical input with the photodiode to perform photoelectric conversion, accumulating charge generated by the photoelectric conversion to modulate a threshold voltage of the first MOS transistor, and outputting a voltage signal corresponding to a voltage obtained by adding a voltage corresponding to the accumulated charge to a reference voltage input to a gate electrode of the first MOS transistor from a source electrode of the first MOS transistor.

3. The detecting device according to claim 2, wherein
   the buffer circuit is a source follower circuit including a second MOS transistor of a channel type the same as a channel type of the first MOS transistor, and having a configuration in which parameters of the second MOS transistor are set so that a voltage gain and a cutoff frequency the same as the voltage gain and the cutoff frequency of the detecting circuit are achieved.

4. The detecting device according to claim 2, wherein
   the buffer circuit includes
   a first source follower circuit having a configuration of including a third MOS transistor having a channel type the same as a channel type of the first MOS transistor and a gate electrode to which the reference voltage is input, and having parameters of the third MOS transistor set so as to have a voltage gain the same as a voltage gain of the detecting circuit, and
   a second source follower circuit having a configuration of including a fourth MOS transistor having a channel type different from a channel type of the third MOS transistor and a gate electrode connected to the source electrode of the third MOS transistor, and having parameters of the fourth MOS transistor set so as to have a cutoff frequency the same as a cutoff frequency of the detecting circuit, and
   the differential signal generation means includes a capacitive element connected between a source electrode of the first MOS transistor and a source electrode of the fourth MOS transistor.

5. The detecting device according to claim 2, wherein
   the buffer circuit includes
   a first source follower circuit having a configuration of connecting a plurality of third MOS transistors each having a characteristic the same as a characteristic of the first MOS transistor in parallel to each other so as to have a voltage gain the same as a voltage gain of the detection circuit, and inputting the reference voltage to gate electrodes of the plurality of third MOS transistors, and
   a second source follower circuit having a configuration of including a fourth MOS transistor having a channel type different from a channel type of the third MOS transistor and a gate electrode connected to the source electrodes of the plurality of third MOS transistors of the first source follower circuit, and having parameters of the fourth MOS transistor set so as to have a cutoff frequency the same as a cutoff frequency of the detecting circuit, and
   the differential signal generation means includes a capacitive element connected between a source electrode of the first MOS transistor and a source electrode of the fourth MOS transistor.

* * * * *